United States Patent
Yamagishi

(12) 
(10) Patent No.: US 6,806,482 B2
(45) Date of Patent: Oct. 19, 2004

(54) PHOTOVOLTAIC SOLID STATE RELAY

(75) Inventor: Kazuo Yamagishi, Shiga (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 0 days.

(21) Appl. No.: 10/694,725

(22) Filed: Oct. 29, 2003

(65) Prior Publication Data

US 2004/0129864 A1 Jul. 8, 2004

(30) Foreign Application Priority Data

Oct. 29, 2002 (JP) ......................................... 2002-314042

(51) Int. Cl.[7] .......................... G02B 27/00; H03K 3/42; H01L 31/00
(52) U.S. Cl. ......................... 250/551; 327/514; 257/290
(58) Field of Search ............................. 250/551, 214 R, 250/214 SW, 214.1, 208.2, 208.4; 327/432, 439, 514, 515; 257/119, 124, 290, 291, 292

(56) References Cited

U.S. PATENT DOCUMENTS 4,755,697 A * 7/1988 Kinzer ........................ 327/432

6,335,538 B1 * 1/2002 Prutchi et al. ............... 250/551

FOREIGN PATENT DOCUMENTS

| JP | 2522249 B2 | 5/1996 |
|---|---|---|
| JP | 3222847 B2 | 8/2001 |

* cited by examiner

*Primary Examiner*—Kevin Pyo
(74) *Attorney, Agent, or Firm*—Sughrue Mion, PLLC

(57) ABSTRACT

A photovoltaic solid state relay has a light-emitting diode for emitting light in response to an electrical control signal. First and second photovoltaic devices are optically coupled to the light-emitting diode for converting the light to first and second voltages, respectively. First and second unipolar transistors are provided having first and second gate electrodes for respectively receiving the first and second voltages and jointly establishing a first current conducting path between output terminals to which a load circuit will be connected. A bipolar transistor is provided having a base connected to a junction between the first and second unipolar transistors for establishing a second current conducting path in parallel to the first current conducting path in one of opposite directions depending on voltages applied to the output terminals.

8 Claims, 7 Drawing Sheets

PHOTOVOLTAIC SOLID STATE RELAY

BACKGROUND OF THE INVENTION

1. Field of the Invention

The present invention relates generally to solid state relays and more specifically to a photovoltaic solid state relay using a bidirectional switch.

2. Description of the Related Art

A photovoltaic solid state relay as disclosed in Japanese Patent No. 2,522,249 includes a photovoltaic diode array and a bidirectional switch formed by a pair of MOSFETs series-connected across a pair of output terminals. The diode array responds to light from a light-emitting diode to generate a voltage corresponding to an electrical control signal supplied to the light-emitting diode. The voltage developed across the photovoltaic diode array is supplied through a discharging circuit to the transistors and applied across their gate electrodes and source electrodes so that the transistors are turned ON, establishing a current conducting path across a pair of output terminals to which an external load circuit is connected. For using the relay in an alternating current load circuit, the source-drain paths of the transistors are connected in opposite sense to each other. Since the impedance across the output terminals, which is desired to be as small as possible, equals the sum of on-resistances of the two transistors, a need exists to reduce the resistance across the output terminals. Furthermore, if the bidirectional switch is used for heavy load circuits, the source and gate electrodes must be connected to respective pads to provide the ability to carry high load current. However, the provision of such a pad structure requires a p-type well to be formed immediately below the pads. This structure would cause the capacitance of the relay to significantly increase, particularly when operating at high frequencies. Therefore, a need exists to reduce the capacitance of a bidirectional solid state relay for high frequency operation with a heavy load circuit.

SUMMARY OF THE INVENTION

It is therefore an object of the present invention to provide a photovoltaic solid state relay having a low output impedance.

Another object of the present invention is to provide a photovoltaic solid state relay having a low capacitance.

According to the present invention, there is provided a photovoltaic solid state relay having a pair of output terminals, comprising light emitting means for emitting light in response to an electrical control signal, first and second photovoltaic devices optically coupled to the light emitting means for converting the light to first and second voltages, respectively, and first and second unipolar transistors having first and second controlling electrodes for respectively receiving the first and second voltages and jointly establishing a first current conducting path between the output terminals. A bipolar transistor is provided having a base connected to a junction between the first and second unipolar transistors for establishing a second current conducting path in parallel to the first current conducting path between the output terminals in one of opposite directions depending on voltages applied to the output terminals.

In a preferred embodiment, the first and second unipolar transistors and the bipolar transistor are fabricated on a common semiconductor-on-insulator structure comprising a semiconductor substrate, a first insulator layer on the substrate, and a semiconductor layer on the first insulator layer. First and second backgate regions are formed in the semiconductor layer and first and second source regions are respectively formed in the first and second backgate regions. A common drain/base region is formed in the semiconductor region between the first and second backgate regions. A first insulated gate electrode is provided, bridging the first source region and the common drain/base region, and a second insulated gate electrode is provided, bridging the second source region and the common drain/base region. A second insulator layer is provided on the semiconductor layer. On the second semiconductor layer, first and second gate pads are formed and respectively connected to the first and second insulated gate electrodes to function as the first and second controlling electrodes of the unipolar transistors. On the second insulator layer, a first source pad is formed and connected to the first source region and the first backgate region and a second source pad is formed and connected to the second source region and the second backgate region, the first and second source pads being respectively connected to the output terminals. With this arrangement, the common drain/base region functions as a common drain of the first and second unipolar transistors and as the base of the bipolar transistor, and the first and second backgate regions respectively function as an emitter and a collector of the bipolar transistor when the first source pad is biased at a voltage higher than the second source pad, and respectively function as a collector and an emitter of the bipolar transistor when the second source pad is biased at a voltage higher than the first source pad.

For proper operation of the bipolar transistor, the first backgate region and the first source region are preferably in the shape of a first loop and the second backgate region and the second source region are in the shape of a second loop on the outer side of the first loop. The common drain/base region is in the shape of a loop between the first and second loops. The first insulated gate electrode is in the shape of a loop lying on the first loop and the second insulated gate electrode is in the shape of a loop lying on the second loop. The semiconductor layer is formed with first and second wells of conductivity type opposite to conductivity type of the semiconductor layer, the first well being surrounded by the common drain/base region and the common drain/base region being surrounded by the second well, the first and second wells penetrating through the semiconductor layer to the first insulator layer.

BRIEF DESCRIPTION OF THE DRAWINGS

The present invention will be described in detail further with reference to the following drawings, in which.

DETAILED DESCRIPTION

Figure 1:
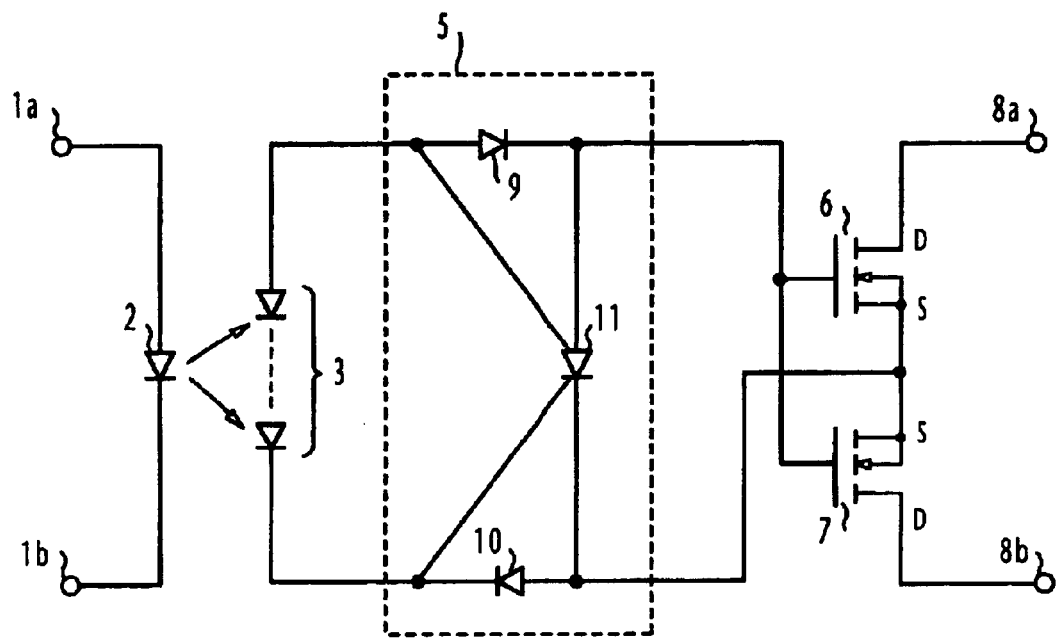
FIG. 1 is a circuit diagram of a prior art photovoltaic solid state relay.

Before proceeding with the detailed description of the present invention, the prior art photovoltaic bidirectional solid state relay, disclosed in Japanese Patent No. 2,522,249, will be described with reference to FIGS. 1 and 2. In the prior art solid state relay, the application of an electrical signal from an external source, not shown, across input terminals 1a and 1b causes a light-emitting diode 2 to emit light to a photovoltaic diode array 3, where the incident light is converted to an electrical signal, which is applied to a discharging circuit 5 including a thyristor 11 which is OFF at this instant. A voltage developed in the photovoltaic diode array 3 causes diodes 9 and 10 of the discharging circuit to be forward-biased, allowing that voltage to be applied across the gates of enhancement type N-channel MOSFETs 6 and 7 and their common source. The drains of these transistors are to output terminals 8a, 8b. Because of the enhancement type, the transistors 6 and 7 are normally OFF. Hence, the output terminals 8a, 8b present "normally-open contacts" to a load circuit before the input voltage is applied to the terminals 1a, 1b. In response to the application of a voltage across the gate electrodes and the common source electrode of transistors 6 and 7, these transistors are turned ON, establishing a current conduction path between the output terminals 8a, 8b.

When the externally applied voltage is removed from the input terminals 1a, 1b, the voltage across the photovoltaic diode array 3 decays with time due to its self-discharging action, causing the diodes 9 and 10 to be turned OFF. As a result, the impedance of the negative and positive gates of the thyristor 11 rises sharply, setting the thyristor in a state ready for conducting. With a further voltage drop across the photovoltaic diode array 3, one of the gates of the thyristor 11 is forward-biased, causing it to turn ON. This results in a low impedance path being established across the gates and common source of the transistors 6, 7. Because of the self-holding nature of the thyristor, the ON state of the thyristor persists until the potential across its anode and cathode drops to 1 volt. Transistors 6, 7 discharge their stored energy through the thyristor 11 and turn OFF.

Transistors 6 and 7 are connected in series in opposite sense to each other. This anti-serial connection enables the solid-state relay to operate in a bidirectional mode. For space and cost reduction, it is undesirable to fabricate the transistors 6, 7 on separate semiconductor chips. In this respect, Japanese Patent No. 3,222,847 discloses a bidirectional solid-state switch integrated on a common silicon substrate. As shown in FIG. 2, the bidirectional solid-state switch of this prior art is comprised of a pair of lateral double diffused MOSFETs of SOI (Silicon On Insulator) structure formed by a silicon substrate 101, an insulating layer 102, and an n (−) type silicon layer 103. On the surface of n (−) silicon layer 103 are formed two n (+) drain regions 104 and 105 on which drain electrodes 114 and 115 are provided, respectively. Also formed in the n (−) layer 103 between the n (+) drain regions 104 and 105 is a p-type well 106 that extends from the surface of layer 103 down to the insulating layer 102 and divides the layer 103 into two transistor regions. In the p-type well 106 are formed two p (+) source regions 107 and 108 which surround the rectangular drain regions 104 and 105, respectively. On the p-type well 106, are formed insulated gate electrodes 112 and 113 which are connected together, and a common source electrode 112 that bridges the source regions 107 and 108. Output terminals 8a and 8b are connected to the drain electrodes 114 and 115, respectively.

Transistors 6 and 7 are turned ON by biasing the gate electrodes 112, 113 positive with respect to the source electrode 117 to create a channel beneath each of the insulated gate electrodes 112 and 113. With the transistors being turned ON, a current conduction path is established from the output terminal 8a to the output terminal 8b by biasing the former positive with respect to the latter. A current conduction path is established in the opposite direction by biasing the terminal 8b positive with respect to the terminal 8a. The transistors are turned OFF by discharging the channels through a short-circuit path established between the common gate electrodes 112, 113 and the source electrode 117.

Since the impedance across the output terminals equals a sum of the on-resistances of the bidirectional transistors, there is a need to reduce this impedance particularly for heavy current applications. Furthermore, if the bidirectional switch is used for heavy loads, the source and gate electrodes must be connected to respective pads to provide capability to carry high load current. However, the provision of such a pad structure requires the p-type well 106 to be formed immediately below the pads. This structure would cause the capacitance of the relay to significantly increase, particularly when operating at high frequencies. Therefore, a need exists to reduce the capacitance of a bidirectional solid state relay for high frequency operation with a heavy load circuit.

Figure 3:
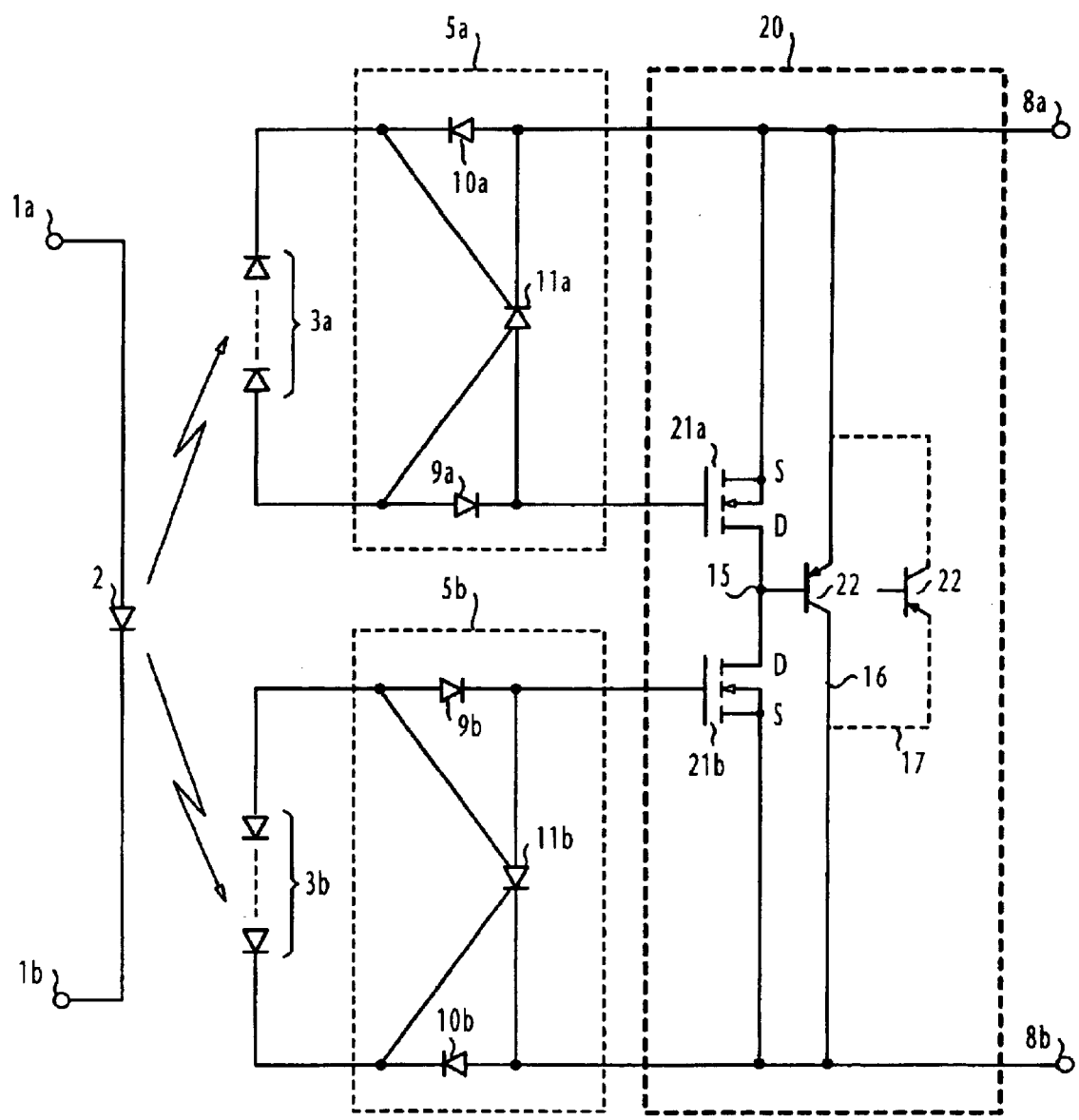
FIG. 3 is a circuit diagram of a photovoltaic solid state relay of the present invention, including a bidirectional switch integrated on a common silicon substrate.
Figure 4:
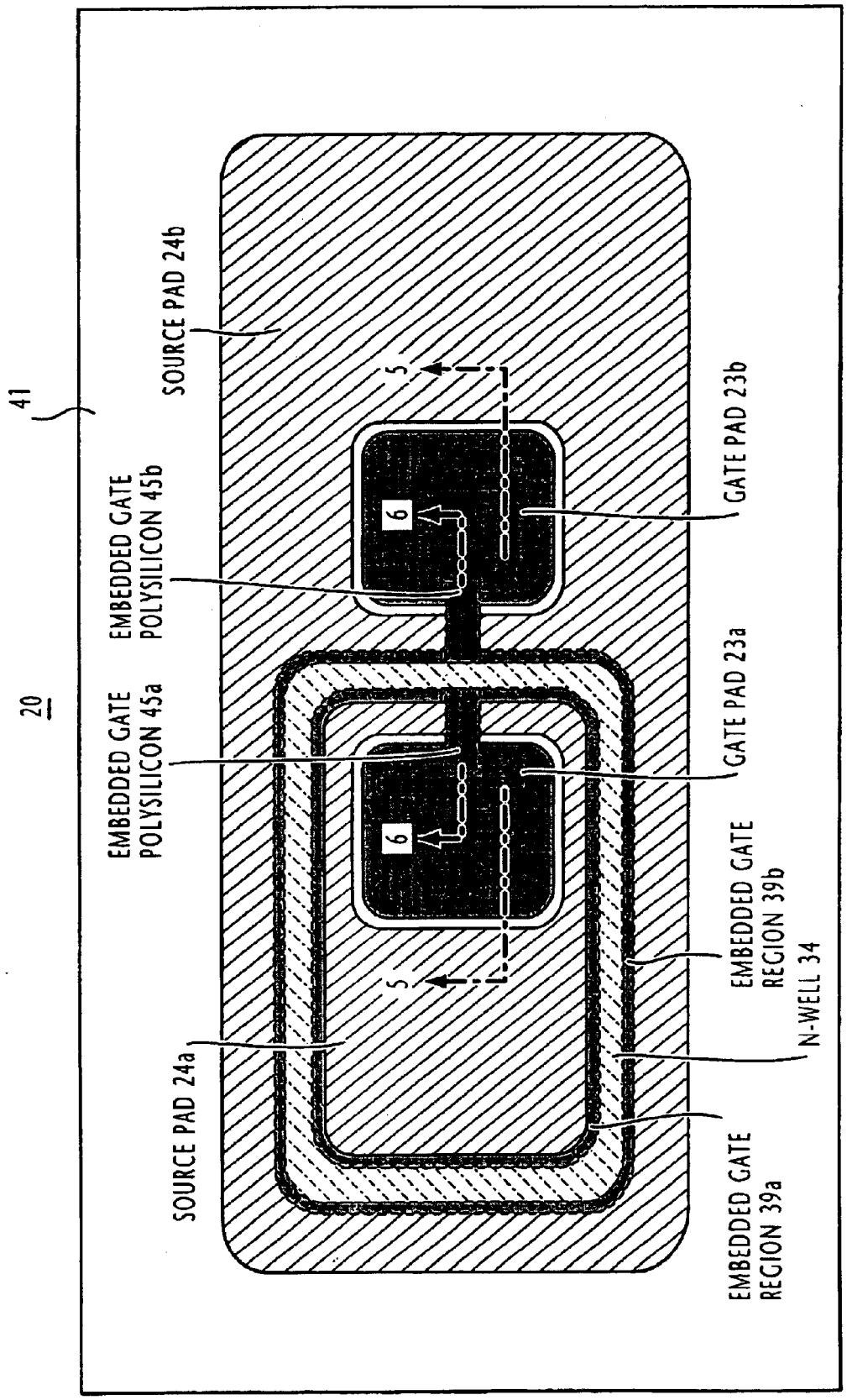
FIG. 4 is a plan view of the bidirectional switch of FIG. 3.

FIG. 3 is a circuit diagram of a photovoltaic bidirectional solid state relay according to a preferred embodiment of the present invention. In the present invention, two photovoltaic diode arrays 3a and 3b are provided for receiving light from the light-emitting diode 2 and two discharging circuits 5a and 5b, each being identical to the discharging circuit 5 of FIG. 1, are connected to the photovoltaic diode arrays 3a and 3b, respectively.

A bidirectional solid state switch 20 is connected to the discharging circuits 5a and 5b. Switch 20 is comprised of enhancement type (normally off), N-channel MOSFETs 21a and 21b having their source electrodes connected to the output terminals 8a and 8b and their drain electrodes connected together to a circuit node 15. The gate electrode of transistor 21a is connected to the cathode of diode 9a and its source connected to the anode of diode 10a. In the same way, the gate electrode of transistor 21b is connected to the cathode of diode 9b and its source connected to the anode of diode 10b.

A PNP transistor 22 is provided having its base connected to the circuit node 15. As described in detail later, the bipolar transistor 22 is constructed so that when the output terminal 8a is biased positive with respect to the output terminal 8b, the bipolar transistor 22 forms its emitter at the output terminal 8a and its collector at the output terminal 8b, as indicated by a solid line 16. When the output terminal 8a is biased negative with respect to the output terminal 8b, the bipolar transistor 22 forms its emitter at the output terminal 8b and its collector at the output terminal 8a as indicated by a broken line 17.

In the absence of an electrical control signal across the input terminals 1a and 1b, the thyristors 11a and 11b of both discharging circuits are in the OFF state. The application of an electrical signal to input terminals 1a and 1b causes a light-emitting diode 2 to emit light to photovoltaic diode arrays 3a, 3b, producing a voltage across their terminals. In the discharging circuit 5a, the voltage developed in the photovoltaic diode array 3a causes diodes 9a and 10a to be forward-biased, biasing the gate of transistor 21a with respect to its source electrode. Simultaneously, in the discharging circuit 5b, the voltage developed in the photovoltaic diode array 3b causes diodes 9b and 10b to be forward-biased, biasing the gate of transistor 21b with respect to its source electrode. In this manner, the transistors 21a and 21b are both turned ON.

Figure 2:
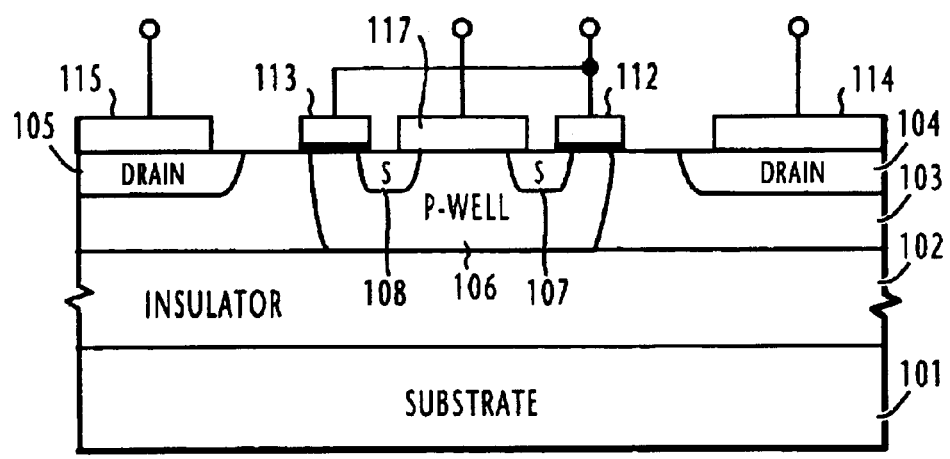
FIG. 2 is a side view of a prior art solid state bidirectional switch integrated on a single semiconductor substrate.

When the electrical control signal is removed from the input terminals 1a, 1b, the thyristors 11a and 11b are turned ON in the same way as described in relation to FIG. 1 and energy stored on the gate electrode of each MOSFET is discharged through the corresponding thyristor and both MOSFETs are turned OFF.

Details of the bidirectional solid state switch 20 will be described below with reference to FIGS. 4 to 7. In the top plan view of FIG. 4, the switch 20 is implemented on a single semiconductor chip. Transistor 21a comprises a gate pad 23a surrounded by an aluminum source pad 24a. Along the outer periphery of the source pad 24a is formed a polysilicon gate electrode 39a embedded in an interlayer insulator 41 in the shape of an inner race track and spaced from the source pad 24a, as seen from FIG. 5. Gate pad 23a and the embedded gate electrode 39a are interconnected by an embedded gate polysilicon 45a as shown in FIG. 6.

Transistor 21b comprises a gate pad 23b surrounded by an aluminum source pad 24b. Along the inner periphery of the source pad 24b is formed a polysilicon gate electrode 39b embedded in the interlayer insulator 41 in the shape of an outer race track so that the gate electrode 39b is isolated from the source pad 24b. Gate pad 23b and the embedded gate electrode 39b are interconnected by an embedded gate polysilicon 45b.

Figure 5:
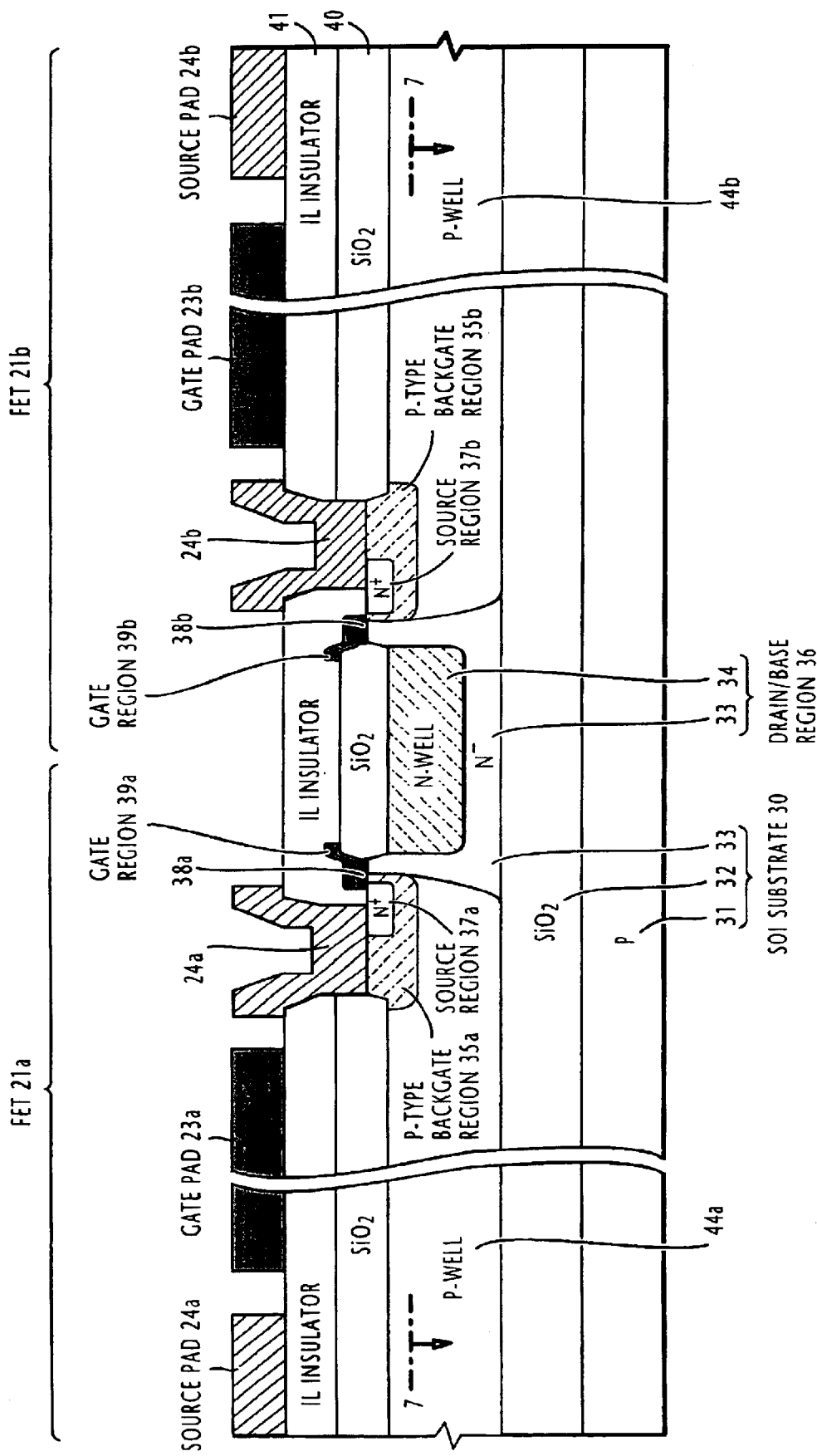
FIG. 5 is a cross-sectional view taken along the line 5—5 of FIG. 4.
Figure 6:
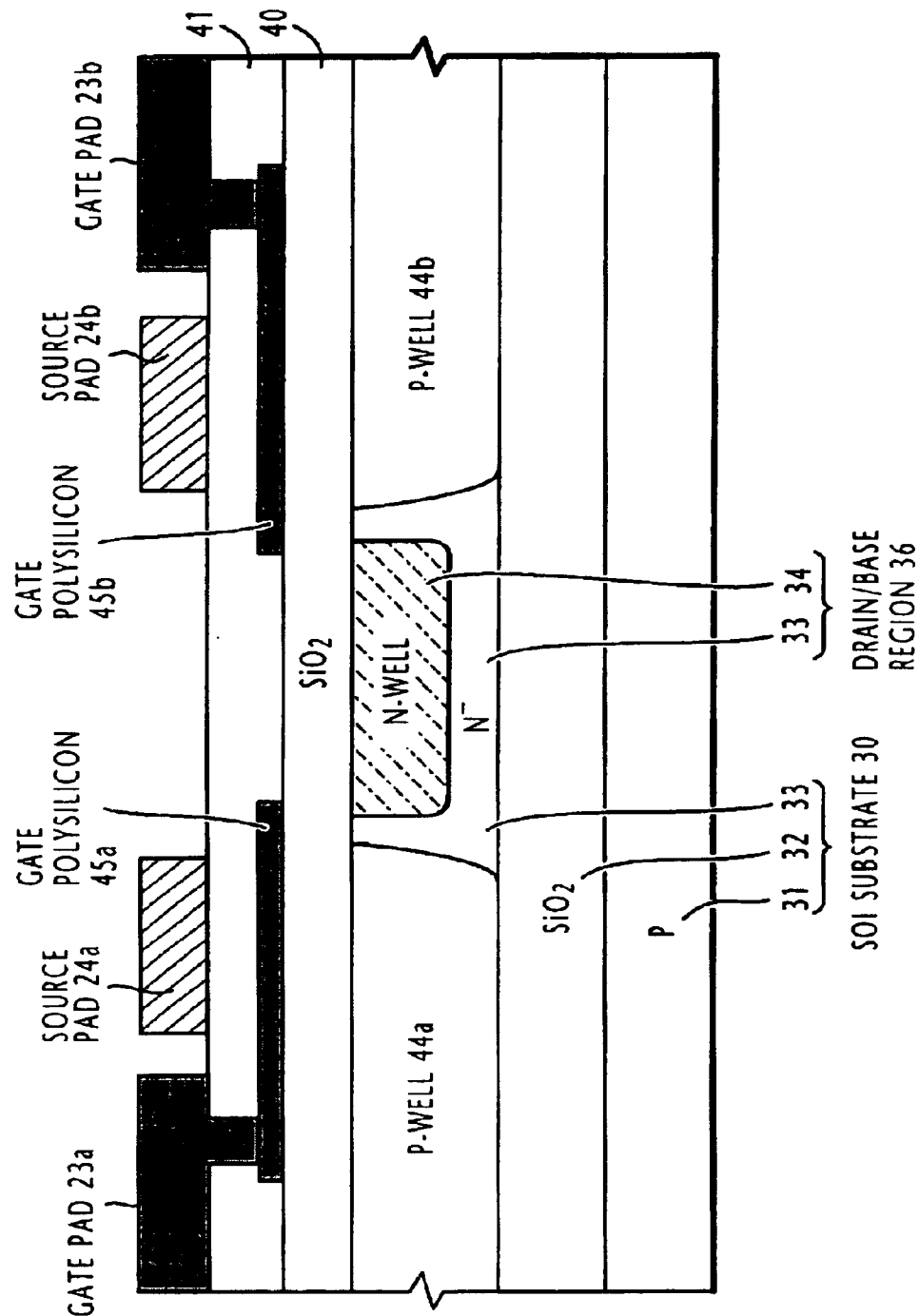
FIG. 6 is a cross-sectional view taken along the line 6—6 of FIG. 4.

As illustrated in FIGS. 5 and 6, the bidirectional solid state switch 20 is fabricated on an SOI (Silicon On Insulator) structure 30 comprising a p-type silicon substrate 31, a silicon dioxide layer 32 and an n (−) type silicon layer 33. Silicon substrate 31 is biased at a floating potential to reduce the drain-substrate capacitance of the bidirectional switch.

A common n-type well 34 is formed in the n (−) silicon layer 33 in the shape of a race track extending along adjacent sides of the gate electrodes 39a and 39b. Within an inner area of the n (−) type silicon layer 33 that is surrounded by and spaced from the n-type well 34, there is formed a p-type well 44a having a depth extending to the silicon dioxide layer 32 and occupying the underlying area of the source pad 24a. Along the outer periphery of the p-type well 44a is formed a p-type backgate region 35a of the MOSFET 21a shaped in a race track pattern, extending along the outer edges of the source pad 24a, as clearly shown in FIG. 7. On the outside of the n-type well 34 is a p-type well 44b having the same depth as the p-type well 44a and occupying the underlying area of the source pad 24b. Along the inner periphery of the p-type well 44b is formed a p-type backgate region 35b of the MOSFET 21b shaped in a race track pattern surrounding the n-type well 34. Therefore, the backgate region 35b extends along the inner edges of the source pad 24b.

Figure 7:
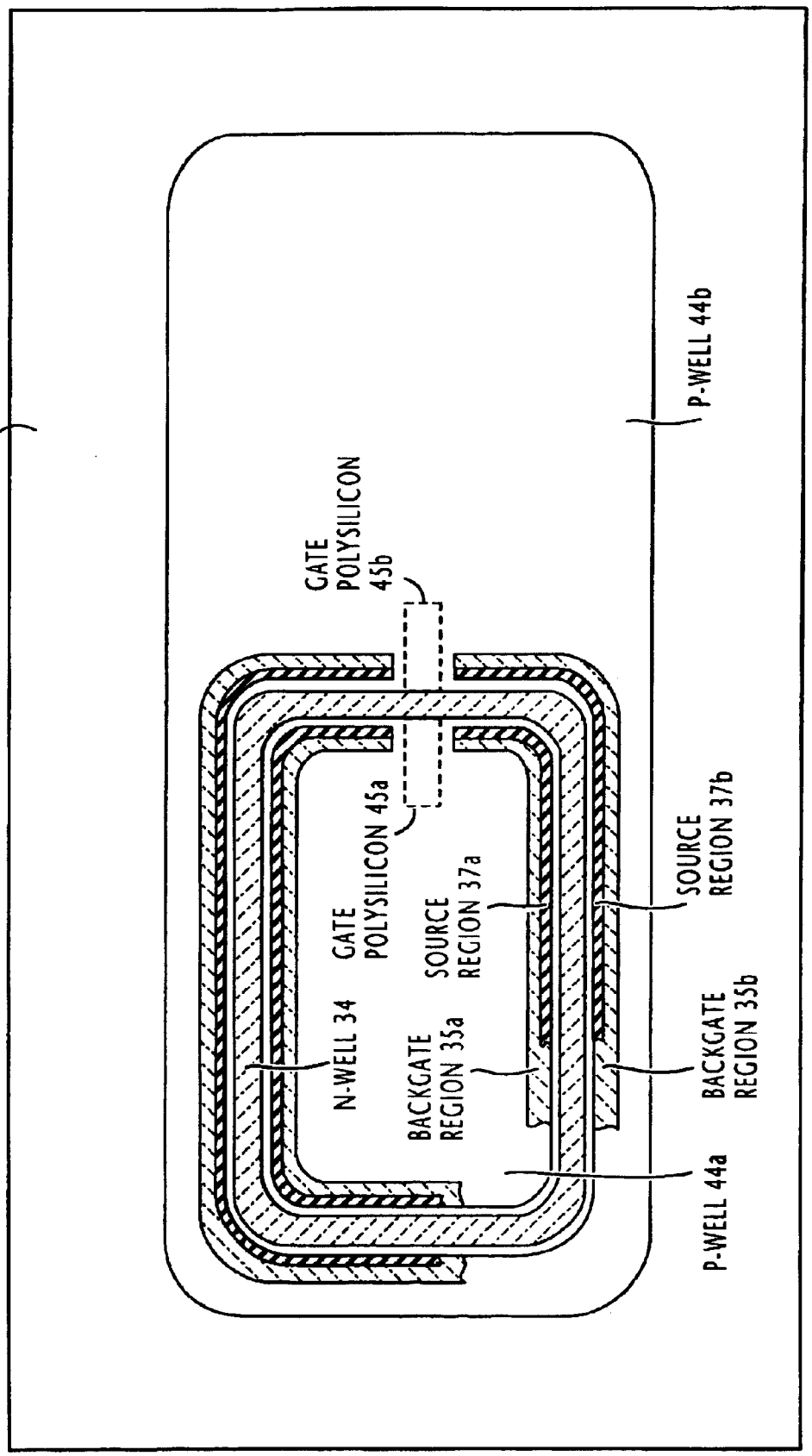
FIG. 7 is a cross-sectional plan view taken along the lines 7—7 of FIG. 5, partly broken to reveal underlying layers.

Along the outer periphery of the backgate region 35a is formed an n (+) source region 37a of a race track pattern having a depth extending from the upper surface of the backgate region 35a (FIG. 7). In the width dimension (FIG. 5), the source region 37a is spaced a predetermined distance from the outer edge of backgate region 35a to define a channel for the MOSFET 21a.

For the MOSFET 21b, an n (+) source region 37b is formed along the inner periphery of the backgate region 35b with a depth extending from the upper surface of the backgate region 35b. Source region 37b is spaced a predetermined distance from the inner edge of backgate region 35b to define the channel of the MOSFET 21b. Polysilicon gate electrode 39a and 39b are insulated from the source region 37a and 38b, respectively, by gate insulators 38a and 38b. Between the interlayer insulator 41 and the n (−) silicon layer 33 is a field oxide film formed by a thick silicon dioxide layer 40.

As shown in FIG. 5, the n-type well 34 and the underlying portion of the n (−) silicon layer 33 constitute a drain/base region 36 which serves as the common drain region of the MOSFETs 21a and 21b as well as the base region of the bipolar transistor 22. Backgate regions 35a and 35b of the MOSFETs 21a, 21b also function as the emitter and collector regions, respectively, of the bipolar transistor 22 when the source pad 24a is biased positive relative to the source pad 24b, or function as the collector and emitter regions, respectively, when the source pad 24b is biased positive relative to the source pad 24a.

Gate pads 23a and 23b are connected to the cathodes of diodes 9a and 9b, respectively. Source pads 24a and 24b are respectively connected to the output terminals 8a and 8b to which the cathodes of diodes 10a and 10b are also respectively connected.

When an electrical control signal is applied to the input terminals 1a and 1b, the gate electrode 39a is biased positive with respect to the source pad 24a and the gate electrode 39b is biased positive with respect to the source pad 24b, creating a channel immediately below each of the gate insulators 38a and 38b. With the MOSFETs 21a and 21b being turned ON, if the source pad 24a is biased positive with respect to the source pad 24b, a current conduction path is established between the source pads 24a and 24b through the channels and the common drain/base region 36. If the voltage between the source pad 24a and the common drain/base region 36 is lower than the forward-bias voltage (VF) of 0.7 to 1.0 volt developed across the source region 37a and the drain/base region 36, the resistance between the output terminals 8a and 8b is equal to the sum of on-resistances of the MOSFETs 21a and 21b. When the voltage between the source pad 24a and drain/base region 36 is higher than the voltage VF, the backgate regions 35a and 35b function as the collector and emitter of the PNP transistor 22 and the transistor 22 is turned ON.

Therefore, in the absence of a voltage across the output terminals 8a and 8b, the PNP transistor 22 is in the OFF state. When a load voltage is applied across the output terminals 8a, 8b, the voltage between the source pad 24a and drain/base region 36 becomes higher than the voltage VF. An additional current conduction path is established from the backgate region 35a, acting as an emitter, through the base region 36 to the backgate region 36b, acting as a collector. In this way, the PNP transistor 22 is turned ON.

With the PNP transistor 22 being turned ON, the voltage across the source pads 24a and 24b is equal to the saturated base-emitter voltage of the transistor 22. Therefore, the resistance between the output terminals 8a and 8b becomes lower than the sum of the on-resistances of the MOSFETs 21a, 21b, i.e., lower than the total on-resistance of the prior art solid state relay of FIG. 1.

If the output terminals 8a, 8b are biased in reverse to that described above, an additional current conduction path is established in the opposite direction, i.e., from the backgate region 35b through the base region 36 to the backgate region 35a.

Bidirectional switch 20 is turned OFF when the electrical control signal is removed from the input terminals 1a, 1b.

When this occurs, the thyristors 11a and 11b are briefly turned ON, causing energy stored in the channel regions of the MOSFETs 21a, 21b to be discharged. With the MOSFETs being turned OFF, the bidirectional switch 20 no longer responds to a voltage which may still be applied to the source pads 24a and 24b after the turn-off of the transistors.

The voltage required to turn-on the PNP transistor 22 can be determined by the gate voltages of the MOSFETs as well as by the current amplification factor of the PNP transistor 22.

Figure 8:
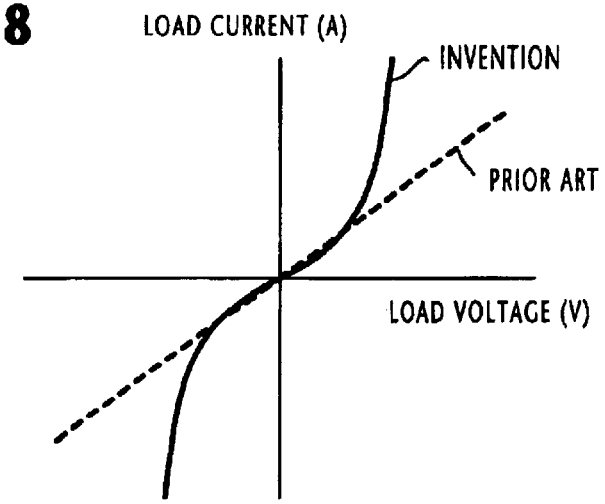
FIG. 8 is a graphic representation of load voltage versus load current characteristic of the present invention.

The load current versus the load voltage characteristic of the present invention is shown in FIG. 8 for comparison with the prior art. For a given load voltage, the present invention allows much higher load current than is possible with the prior art.

In addition, the bidirectional solid state relay of the present invention has a low capacitance compared to the prior art. As illustrated in FIG. 7, the p-type wells 44a and 44b are formed below the gate pads 23a, 23b and source pads 24a, 24b. These p-type wells are isolated from the overlying electrode pads by means of the silicon dioxide layer 40 and the interlayer insulator 41. Due to this isolating structure, the PN junction area of the bidirectional switch that affects the drain-source capacitance is kept to a minimum.

Figure 9:
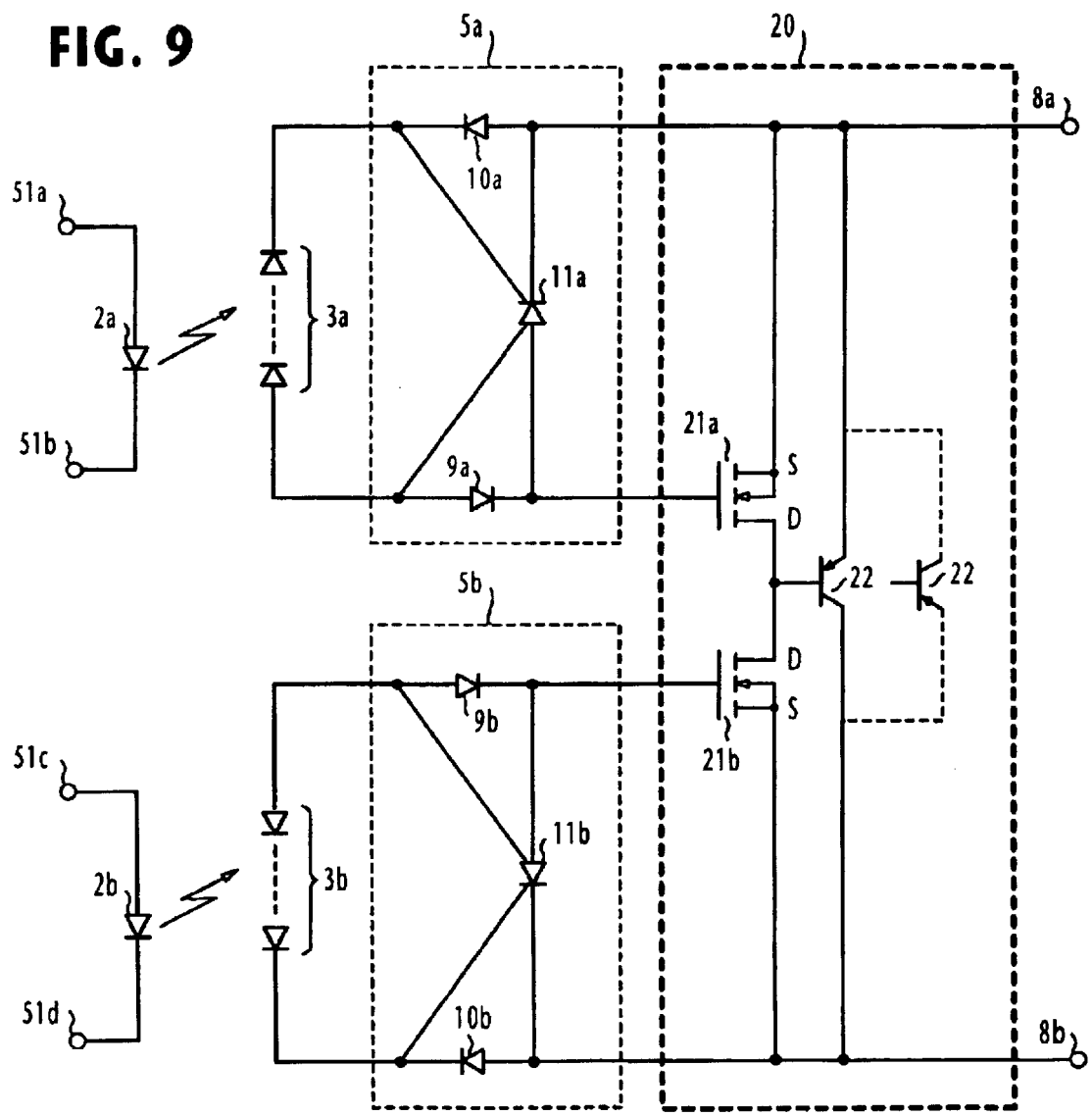
FIG. 9 is a circuit diagram of a modified embodiment of the present invention.

FIG. 9 is a circuit diagram of a modification of the present invention in which parts corresponding to those in FIG. 3 are marked with the same numerals as those used in FIG. 3. In this embodiment, a first light-emitting diode 2a is connected across a pair of input terminals 51a, 51b and a second light-emitting diode 2b is connected across a pair of input terminals 51c, 51d. LEDs 2a and 2b are respectively associated with the photovoltaic diode arrays 3a and 3b.

The solid state relay of FIG. 9 operates in one of the following three modes:

Mode 1

In mode 1, two electrical control signals are simultaneously applied to the input terminals 51a, 51b and the input terminals 51c, 51d. In this mode, the bidirectional solid state relay operates in the same manner as in the previous embodiment.

Mode 2

In mode 2, only one electrical control signal is applied to one of the input terminal pairs 51a to 51d so that only one of the MOSFETs 21a, 21b which is connected to the output terminal whose voltage is lower than the other output terminal, is turned ON. Assume that the output terminal 8a is supplied with a higher load voltage than the output terminal 8b. If an electrical control signal is applied across the input terminals 51c and 51d, the MOSFET 21b is turned ON. When the voltage between the source pad 24a and the common drain/base region 36 exceeds the voltage VF between the source region 37a and the drain/base region 36, the PNP transistor 22 is turned ON. Similar event occurs if the output terminal 8b is supplied with a higher load voltage than the output terminal 8a and an electrical control signal is applied across the input terminals 51a and 51b. In this case, the MOSFET 21a is turned ON. Since the voltage between the source pad 24b and the common drain/base region 36 exceeds the voltage VF between the source region 37b and the drain/base region 36, the PNP transistor 22 is turned ON.

Mode 3

In mode 3, two electrical control signals are supplied simultaneously to the input terminals 51a to 51d If the output terminal 8a is supplied with a higher load voltage than the output terminal 8b and two electrical control signals are supplied simultaneously to the input terminals 51a to 51d, the MOSFETs 21a and 21b are turned ON. If the electrical signal is removed from the input terminals 51a and 51b before the voltage between the source pad 24a and the drain/base region 36 exceeds the voltage VF, the MOSFET 21a is turned OFF. When the voltage between the source pad 24a and the drain/base region 36 subsequently exceeds the voltage VF, the PNP transistor 22 is turned ON. A similar event occurs if the output terminal 8b is supplied with a higher load voltage than the output terminal 8b and two electrical control signals are supplied simultaneously to the input terminals 51a to 51d, causing the MOSFETs 21a and 21b to be turned ON. If the electrical signal is removed from the input terminals 51c and 51d before the voltage between the source pad 24b and the drain/base region 36 exceeds the voltage VF, the MOSFET 21b is turned OFF. When the voltage between the source pad 24b and the drain/base region 36 subsequently exceeds the voltage VF, the PNP transistor 22 is turned ON. The solid state relay is turned OFF by clearing the electrical control signal supplied to the input terminals.

What is claimed is:

1. A photovoltaic solid state relay having a pair of output terminals, comprising:

light emitting means for emitting light in response to an electrical control signal;

first and second photovoltaic devices optically coupled to said light emitting means for converting said light to first and second voltages, respectively;

first and second unipolar transistors having first and second controlling electrodes for respectively receiving said first and second voltages and jointly establishing a first current conducting path between said output terminals; and a bipolar transistor having a base connected to a junction between said first and second unipolar transistors for establishing a second current conducting path in parallel to said first current conducting path between said output terminals in one of opposite directions depending on voltages applied to said output terminals.

2. The photovoltaic solid state relay of claim 1, wherein said first and second unipolar transistors and said bipolar transistor comprise:

a semiconductor substrate;

a first insulator layer on said substrate;

a semiconductor layer on said first insulator layer;

first and second backgate regions formed in said semiconductor layer;

first and second source regions respectively formed in said first and second backgate regions;

a common drain/base region formed in said semiconductor region between said first and second backgate regions;

a first insulated gate electrode bridging said first source region and said common drain/base region, and a second insulated gate electrode bridging said second source region and said common drain/base region;

a second insulator layer on said semiconductor layer;

first and second gate pads formed on said second insulator layer and respectively connected to said first and second insulated gate electrodes to function as said first and second controlling electrodes of the unipolar transistors;

a first source pad formed on said second insulator layer and connected to said first source region and said first backgate region and a second source pad formed on said second insulator layer and connected to said second source region and said second backgate region, said first and second source pads being respectively connected to said output terminals, said common drain/base region functioning as a common drain of said first and second unipolar transistors and as said base of said bipolar transistor, said first and second backgate regions respectively functioning as an emitter and a collector of said bipolar transistor when said first source pad is biased at a voltage higher than said second source pad, and respectively functioning as a collector and an emitter of the bipolar transistor when said second source pad is biased at a voltage higher than said first source pad.

3. The photovoltaic solid state relay of claim 2, wherein said first backgate region and said first source region are in the shape of a first loop and said second backgate region and said second source region are in the shape of a second loop on the outer side of said first loop, wherein said common drain/base region is in the shape of a loop between said first and second loops, and wherein said first insulated gate electrode is in the shape of a loop lying on said first loop and said second insulated gate electrode is in the shape of a loop lying on said second loop.

4. The photovoltaic solid state relay of claim 3, wherein said semiconductor layer is formed with first and second wells of conductivity type opposite to conductivity type of said semiconductor layer, said first well being surrounded by said common drain/base region and said common drain/base region being surrounded by said second well, said first and second wells penetrating through said semiconductor layer to said first insulator layer.

5. The photovoltaic solid state relay of claim 2 or 3, wherein said second insulator layer is of a two-layered structure including a field oxide layer immediately above said semiconductor layer.

6. The photovoltaic solid state relay of claim 2 or 3, wherein said first and second source pads are formed above said first and second wells, respectively, and wherein said first and second gate electrodes are formed within said first and second source pads, respectively.

7. The photovoltaic solid state relay of claim 1 or 2, wherein said light emitting means comprises a first light emitting diode optically coupled to said first photovoltaic device and a second light emitting diode optically coupled to said second photovoltaic device.

8. The photovoltaic solid state relay of claim 1, further comprising:

a first discharging circuit connected between said first photovoltaic device and said first unipolar transistor for discharging energy stored in said first unipolar transistor at the instant said first voltage becomes nonexistent, and a second discharging circuit connected between said second photovoltaic device and said second unipolar transistor for discharging energy stored in said first unipolar transistor at the instant said second voltage becomes nonexistent.

* * * * *